April 23, 1968 C. G. GLENN 3,379,046

ELECTRONIC COMPONENT LEAD FORMING TOOL

Filed Oct. 24, 1965 3 Sheets-Sheet 1

INVENTOR.
C.G. GLENN

BY G. H. McCay

ATTORNEYS

April 23, 1968 C. G. GLENN 3,379,046

ELECTRONIC COMPONENT LEAD FORMING TOOL

Filed Oct. 24, 1965 3 Sheets-Sheet 2

INVENTOR
C.G. GLENN

BY [signature]

ATTORNEYS

INVENTOR.
C. G. GLENN
BY G. Tm McCoy
ATTORNEYS 3,379,046

ELECTRONIC COMPONENT LEAD FORMING TOOL

C. G. Glenn, 6th St. SW., Arab, Ala. 35016
Filed Oct. 24, 1965, Ser. No. 505,075
16 Claims. (Cl. 72—401)

ABSTRACT OF THE DISCLOSURE

A hand tool capable of bending the leads of electronic components, such as resistors or capacitors, without damaging the leads or doing internal damage to the component itself. The tool is constructed somewhat like a pair of pliers but has adjustable jaws, so that the upper jaw overlaps the lower jaw in closed position. The lower jaw is arranged to firmly hold a component by its leads in a removable component holding die, while the upper jaw pivots down and neatly bends the leads of the component.

The invention described herein may be manufactured and used by or for the Government of the United States of America for governmental purposes without the payment of any royalties thereon or therefor.

The invention relates to a wire forming tool and more particularly to an electronic component lead former.

In electronic circuit design work, it has been found that electronic components such as resistors or capacitors that are to be mounted on printed circuit boards must have their leads bent to substantially match the spacing of the openings in the printed circuit board. Because bending the leads with hand-held pliers frequently causes sufficient damage to the bend radius or internal damage to the component itself to require component rejection, several attempts have been made to develop a satisfactory tool for accurately forming the leads without damaging the component. However, none of the tools heretofore developed have been easily adjustable to fit components of various sizes.

Accordingly, it is an object of this invention to provide an adjustable hand tool for accurately forming the leads of electronic components.

Yet another object is to provide a tool for bending leads of various size electronic components.

These and other objects are accomplished by a tool having two lever arms related to each other in a manner similar to the lever arms of a pair of pliers. Each lever arm has a handle and a jaw. The tool has one yoke-shaped upper jaw which is used to form the leads. The lower jaw includes a removable component holding die which holds the component firmly by each of its leads. The component holding die is arranged to pivot up inside the yoke of the other jaw. The yoke-shaped upper jaw has adjustable die blocks which may be adjusted so as to fit rather snugly against the sides of the component holding die when the jaws are closed. Thus, when the component holding die on the lower jaw is holding an electronic component, and the die blocks on the upper jaw are properly spaced, the two jaws may be pivoted together so as to force the leads of the component downward in a neat right-angle bend, as is desired. The tool performs this function while firmly holding the leads of the component at a point near the body of the component. Thus, damage to both the leads and the component is prevented, and the leads are formed in a much more uniform manner than is possible with other hand tools.

This will be more readily understood by the following detailed description when taken together with the accompanying drawings, in which.

Figures 1, 2:
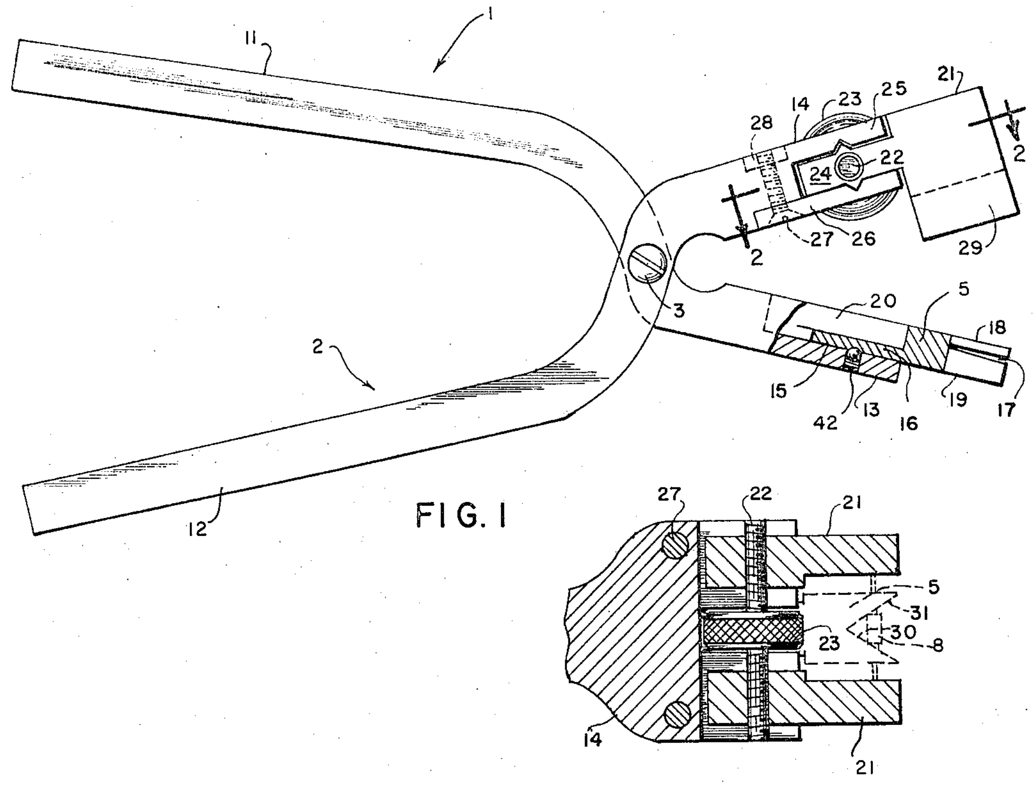
FIGURE 1 is a side elevational view of a lead wire forming tool, in the open position.
FIGURE 2 is a horizontal sectional view of one jaw of the lead wire forming tool of FIGURE 1.
Figure 3:
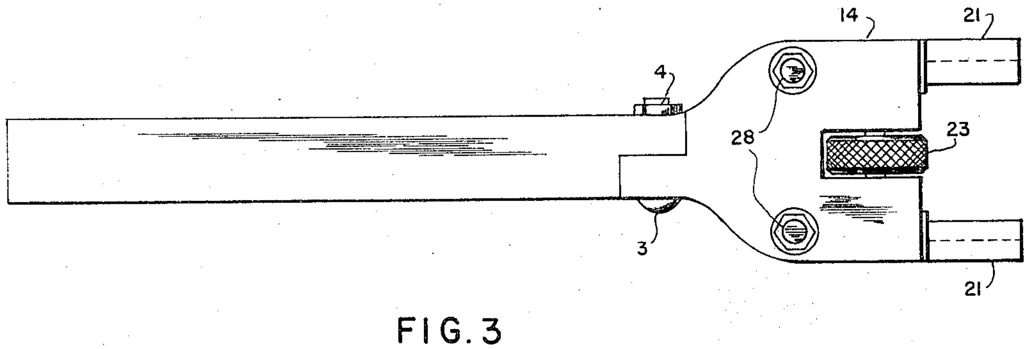
FIGURE 3 is a top view of the lead wire forming tool of FIGURE 1.

Referring now to FIGURES 1 through 6 of the drawings, and particularly to FIGURE 1, there is illustrated the electronic component lead forming tool of the instant invention. Numerals 1 and 2 designate generally two levers which are fastened together and pivoted at bolt 3. The levers 1 and 2 have handles 11 and 12 and jaw portions 13 and 14, respectively. The jaw 13 of lever 1 contains a channel recess 15 which receives a plug 16 for an electronic component holding die 5 having clamping elements 18 and 19. Adjacent to channel recess 15 is a slot 20 which accommodates thumb wheel 23 when the jaws are in the closed position, as will be discussed below.

The jaw 14 of lever 2 holds two die blocks 21 which are mounted substantially parallel to each other on adjusting screw 22 having knurled thumb wheel 23. When the thumb wheel 23 is turned in a clockwise direction, as seen in FIGURE 1, the blocks 21, having guide portions 24, move apart. Turning the thumb wheel 23 in a counter-clockwise direction causes the blocks 21 to move closer together. The tips of the blocks 21 move between tip 25 of jaw 14 and plate 26, which is securely attached to jaw 14 by screws 27 and nuts 28. The lower inside corners of die blocks 21 are faced with nylon bearing surfaces 29 which may be easily replaced when necessary by removing screws 51.

Figures 4, 5, 6, 7:
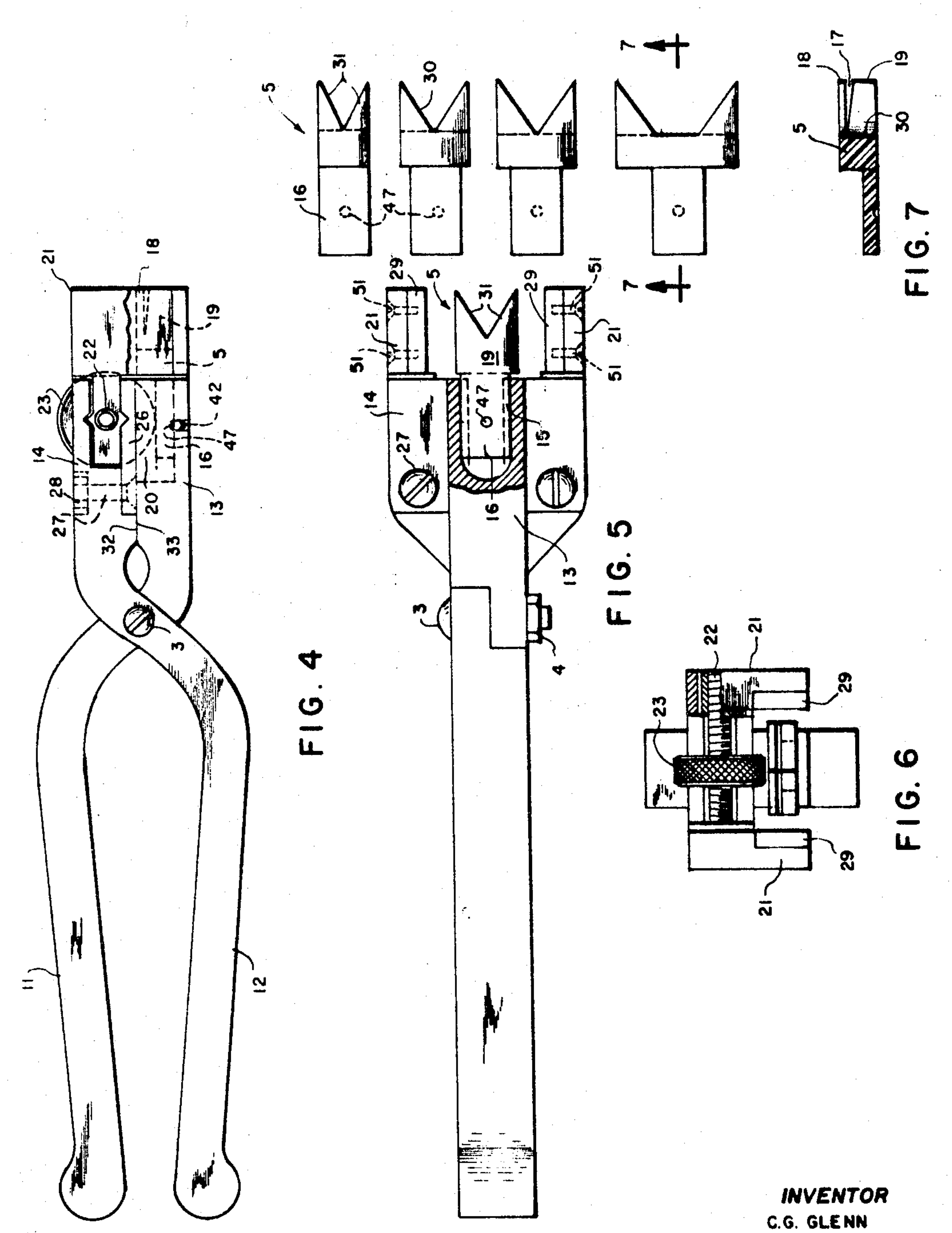
FIGURE 4 is a side elevational view of the lead wire forming tool of FIGURE 1, in the closed position.
FIGURE 5 is a bottom view of the lead wire forming tool of FIGURE 1, with the lower jaw of the tool shown in partial section.
FIGURE 6 is an end view of the lead wire forming tool of FIGURE 1, with part in the upper jaw of the tool shown in section.
FIGURE 7 is a vertical sectional view of a die for holding an electronic component, as also shown in FIGURES 1 to 6.

When the electronic component lead bending tool of FIGURE 1 is closed, as shown in FIGURE 4, electronic component holding die 5 is moved between die blocks 21 and the lower portion of thumb wheel 23 fits into slot 20 so as to allow the inner faces 32 and 33 of the two jaws to fit together flush.

Figures 9, 10:
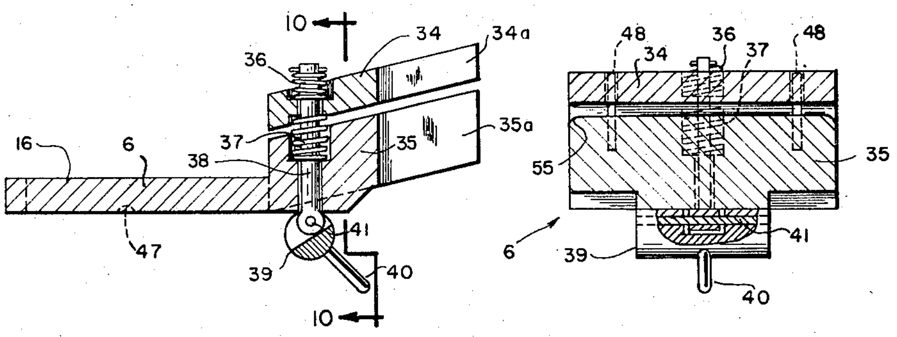
FIGURE 9 is a side vertical sectional view of the die of FIGURE 8.
FIGURE 10 is an end vertical sectional view of the die of FIGURES 8 and 9.
Figure 11:
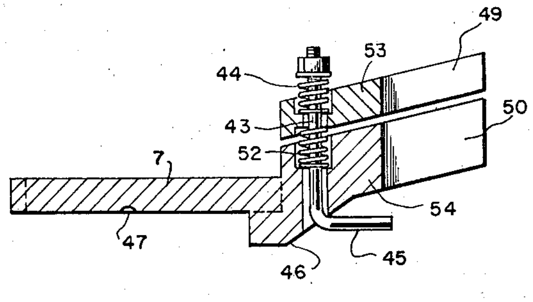
FIGURE 11 is a vertical sectional view of a third embodiment of a die for holding an electronic component.

FIGURES 7, 9, and 11 show vertical sectional views of three different embodiments of the electronic component holding die. FIGURE 7 shows the die in its simplest form 5, as also shown in FIGURES 1, 2, 4, 5 and 6. In this embodiment, the gripping or clamping elements of the die are formed by cutting a horizontal slit in the plastic die so as to form an upper flexible lip 18 and a lower stiff lip 19. A V-shaped cut 30 is also made in the end portion of the die so as to form two spaced apart projecting fingers 31, as can best be seen in FIGURES 2 and 5.

Figure 8:
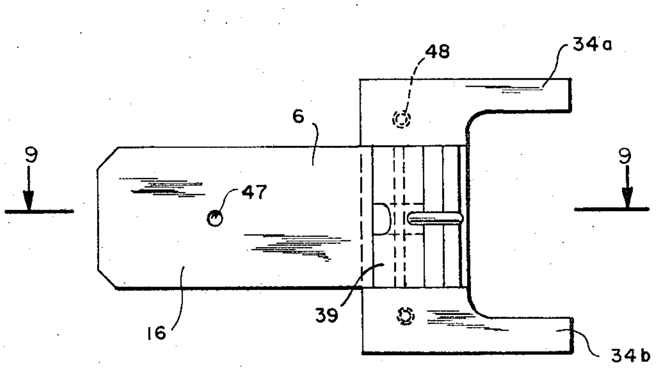
FIGURES 8 is a bottom view of another, more preferred embodiment of a die for holding an electronic component.

FIGURES 8, 9 and 10 show the preferred embodiment 6 of the electronic component holding die. Gripping or clamping elements 34 and 35 are yoke-shaped so as to each have projecting clamping finger elements 34*a* and 34*b* and 35*a* and 35*b*, respectively. Thus clamping finger elements 34*a* and 35*a* cooperate to form one clamping finger 34*a*, 35*a* and finger elements 34*b* and 35*b* cooperate to form clamping finger 34*b*, 35*b*. Clamping elements 34 and 35 are biased open by springs 36 and 37, mounted on cam rod 38. The clamping elements 34 and 35 are maintained in a parallel relationship with respect to each other by guide pins 48. Cam rod 38 is pivotally attached to cam 39 and handle 40 with pivot pin 41. Movement of the handle 40 in a clockwise direction as viewed in FIGURE 9 moves the high side of the cam upward, pulling down cam rod 38 against the force of the springs 36 and 37 and pulling the clamping elements 34 and 35 into the closed position. When cam 39 is moved back to the position shown in FIGURE 9, the spring 37 exerts pressure upward against clamping elements 34, causing the elements 34 and 35 to separate. Plug 16 is held in position by spring loaded ball detent 42 engaging with socket 47 in a manner well known in the mechanical arts.

FIGURE 11 shows another embodiment 7 of the electronic component holding die which is similar to embodiment 6 shown in FIGURES 8, 9 and 10. In embodiment 7 the cam rod 43 is biased upward by spring 44 and is held in position by a lower portion 45 bent upward so that it makes a 90 degree angle with the main portion of the cam rod 43. The cam rod may be pulled downward by turning the handle 45 through an angle of 180 degrees thus moving the handle 45 against the face of inclined plane surface 46. Thus the springs 44 and 52 are compressed and clamping elements 53 and 54 are brought together. When handle 45 of cam rod 43 is turned back to the position shown in FIGURE 11, spring 52 exerts pressure upward to cause clamping elements 53 and 54 to move apart.

Clamping element 34 and springs 36 and 37 of embodiment 6 shown in FIGURE 9 are interchangeable with the clamping element 53 and springs 44 and 52, the corresponding parts of embodiment 7 shown in FIGURE 11. Finger portions 49 and 50 correspond to finger portions 34*a* and 35*a* respectively in the embodiment shown in FIGURE 9.

The electronic component lead forming tool is prepared for operation as follows: The plug 16 of the electrical component holding die 5, 6 or 7 is inserted into the channel recess 15 of jaw 13. Thumb wheel 23 is then turned in the appropriate direction necessary to space the die blocks 21 so that the component holding die fits snugly between the die blocks 21 when the bending tool is in the closed position.

The electronic component lead forming tool is operated by placing an electronic component 8 having straight wire leads into the electronic component lead holding, as shown in FIGURE 2. In the embodiment 6 shown in FIGURES 8, 9, and 10, for example, one lead is positioned between finger portions 34*a* and 35*a* and the other lead is positioned between finger portions 34*b* and 35*b*. The body of the electronic component is then centered between the two projecting fingers, 34*a*, 35*a* and 34*b*, 35*b*, as described above. The cam handle 40 is then turned to lock the clamping elements 34 and 35 of the holding die in closed position. The handles 11 and 12 of the lead forming tool are then grasped firmly and brought together so as to cause the jaws 13 and 14 to be closed. The leads of the electronic component are thus forcefully brought into contact with nylon facings 29 of die blocks 21 and the leads are bent downward.

During the forming of the leads, the section of the leads next to the component is held firmly by the clamping fingers so that there is no stress transmitted to the part of the leads entering into the component itself. This also insures that the minimum distance of the bend from the component end seal shall be at least $\frac{1}{16}$ inch, which is desirable.

In the electronic component holding dies of embodiments 6 (FIG. 9) and 7 (FIG. 11), the clamping elements are set at an angle of about 13 degrees with the horizontal so that the top surfaces of lower clamping elements 35 and 54, respectively, are parallel with the bottom surface of die blocks 21 at the instant the forming process begins. This design feature insures that the electronic component will not move laterally at this instant.

The upper outside edges of lower clamping elements 35 (FIGS. 9 and 10) or 54 (FIG. 11) are rounded, as may best be seen at 55 in FIGURE 10. It has been found that the radius of the bend should be such as to be equal to or slightly greater than twice the diameter of the electronic component leads.

From the foregoing, it may be seen that applicant has invented an electronic component lead forming tool which is lightweight, portable, and which is capable of forming leads quickly, neatly, and without damage to the leads or component, for circuit design use where the use of mass production tools is not feasible.

Obviously, numerous modifications and variations of the present invention are possible in the light of the above teachings. It is therefore to be understood that within the scope of the appended claims, the invention may be practiced otherwise than as specifically described.

What is claimed is:

1. An electronic component lead forming tool comprising:
   (a) a pair of levers pivoted together substantially between their ends, each lever pivoted so as to have a handle portion at one end of the lever and a jaw portion at the other end,
   (b) said jaw portion of one lever having a yoke-shaped end portion,
   (c) said jaw portion of the other lever having a clamping means located at its end,
   (d) whereby the clamping means may be used to grip an electronic component and the said pivoted levers may be moved to the closed position for the purpose of forming the leads of the component.

2. An electronic component lead forming tool comprising:
   (a) a pair of levers pivoted together substantially between their ends, each lever pivoted so as to have a handle portion at one end of the lever and a jaw portion at the other end,
   (b) said jaw portion of one lever having two elongated die blocks spaced apart,
   (c) said jaw portion of the other lever having an end portion consisting of two spaced-apart projecting fingers, whereby an electrical component having two lead wires may be held in position between the fingers, and the said pivoted levers may be moved to the closed position for the purpose of forming the leads of the component.

3. The electrical component lead forming tool of claim 2 where the said die blocks each have an edge facing the opposite jaw portion.

4. The electrical component lead forming tool of claim 2 wherein the said spaced-apart projecting fingers are split so that each finger includes two gripping elements.

5. The device of claim 4 wherein the said two gripping elements comprise an upper flexible lip and a lower stiff lip, whereby a component having two lead wires may be held in position between the said spaced-apart fingers by each lead wire being gripped and frictionally held between the two finger elements of one of said fingers.

6. The electrical component lead forming tool of claim 2 wherein the jaw portion of the said other lever has a channel recess opening on the end portion of the lever and including an electrical component holding die having a plug which fits into said channel recess, said plug holding the said two spaced-apart fingers.

7. The device of claim 6 wherein the said spaced apart fingers are split so as to include two gripping elements.

8. The device of claim 7 wherein the said two gripping elements comprise an upper flexible lip and a lower stiff lip, whereby a component having two lead wires may be held in position between the said spaced-apart fingers by each lead wire being gripped and frictionally held between the two gripping elements of one of said fingers.

9. The device of claim 7 wherein the said two gripping elements are connected together by a spring-biased cam rod means operatively connected to cam means arranged to close the said gripping elements.

10. The device of claim 9 wherein the said cam rod means is biased into a downward position by an inclined plane surface mounted on one of the said gripping elements and thereby pulls the said gripping elements into a closed position.

11. The device of claim 9 wherein the said cam rod means is operatively connected to a cam with a handle whereby the handle may be turned, thus turning the cam and causing the said clamping means to be biased into a closed position.

12. An electronic component lead forming tool comprising:

(a) a pair of levers pivoted together substantially between their ends, each lever pivoted so as to have a handle portion at one end of the lever and a jaw portion at the other end, (b) said jaw portion of one lever having two elongated die blocks spaced apart and laterally adjustable, each said die block having an edge facing the opposite jaw portion, (c) said jaw portion of the other lever having a channel recess opening on the end portion of the lever, (d) a plug, fitted into said channel recess, said plug having two spaced apart projecting fingers, said fingers each being split so as to form an upper flexible lip and a lower stiff lip, whereby a component may be positioned between the fingers and held in position by the two lead wires being frictionally gripped between the two lips of each finger, and the said pivoted levers may be moved to the closed position for the purpose of forming the leads of the component.

13. An electronic component lead forming tool comprising:

(a) a pair of levers pivoted together substantially between their ends, each lever pivoted so as to have a handle portion at one end of the lever and a jaw portion at the other end, (b) said jaw portion of one lever having two elongated die blocks spaced apart, each said die block having an edge facing the opposite jaw portion, (c) said jaw portion of the other lever having a channel recess opening on the end portion of the lever, (d) a plug fitted into said channel recess, said plug having two spaced apart projecting fingers, each said finger comprising two clamping elements, whereby a component may be inserted between the fingers and held in position by the two lead wires being frictionally gripped between the two lips of each finger, and the said pivoted levers may be moved to the closed position for the purpose of forming the leads of the component.

14. The electronic component lead forming tool of claim 13 wherein the two clamping elements consist of an upper element having a flexible lip and a lower element having a stiff lip.

15. The electronic component lead forming tool of claim 13 wherein one of the two clamping elements has an inclined plane surface and including a cam rod means having a spring whereby the clamping elements are normally biased open by the spring but are biased closed when the rod means is turned against the face of the inclined plane surface.

16. The electronic component lead forming tool of claim 13 including a cam rod means connecting the clamping elements together, a spring which holds the clamping elements apart, and a cam including a handle connected to the sam rod means so that movement of the handle turns the cam and closes the clamping elements against the force of the spring.

References Cited

UNITED STATES PATENTS

| | | | |
|---|---|---|---|
| 1,141,916 | 6/1915 | Aderer | 72—389 |
| 2,755,692 | 7/1956 | Wallshein | 72—389 |
| 3,244,201 | 4/1966 | Wallshein | 72—389 |

CHARLES W. LANHAM, *Primary Examiner.*

R. D. GREFE, *Assistant Examiner.*